US008299519B2

(12) United States Patent
Chou et al.

(10) Patent No.: US 8,299,519 B2
(45) Date of Patent: Oct. 30, 2012

(54) READ TRANSISTOR FOR SINGLE POLY NON-VOLATILE MEMORY USING BODY CONTACTED SOI DEVICE

(75) Inventors: Anthony I. Chou, Hopewell Junction, NY (US); Arvind Kumar, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 12/685,335

(22) Filed: Jan. 11, 2010

(65) Prior Publication Data
US 2011/0169064 A1 Jul. 14, 2011

(51) Int. Cl.
H01L 27/092 (2006.01)
(52) U.S. Cl. .......................... 257/315; 257/347
(58) Field of Classification Search .......... 257/315–324, 257/347, E27.112, E27.067
See application file for complete search history.

(56) References Cited

U.S. PATENT DOCUMENTS

| | | |
|---|---|---|
| 5,160,989 A | 11/1992 | Houston |
| 5,185,280 A | 2/1993 | Houston et al. |
| 5,465,231 A | 11/1995 | Ohsaki |
| 5,498,882 A | 3/1996 | Houston |
| 5,907,170 A | 5/1999 | Forbes et al. |
| 5,909,618 A | 6/1999 | Forbes et al. |
| 5,914,511 A | 6/1999 | Noble et al. |
| 5,960,265 A | 9/1999 | Acovic et al. |
| 5,973,356 A | 10/1999 | Noble et al. |
| 6,044,018 A | 3/2000 | Sung et al. |
| 6,054,732 A | 4/2000 | Ho et al. |
| 6,072,209 A | 6/2000 | Noble et al. |
| 6,104,061 A | 8/2000 | Forbes et al. |
| 6,124,729 A | 9/2000 | Noble et al. |
| 6,143,636 A | 11/2000 | Forbes et al. |
| 6,156,607 A | 12/2000 | Noble et al. |
| 6,165,836 A | 12/2000 | Forbes et al. |
| 6,191,448 B1 | 2/2001 | Forbes et al. |
| 6,191,980 B1 | 2/2001 | Kelley et al. |
| 6,240,004 B1 | 5/2001 | Kuo et al. |
| 6,261,884 B1 | 7/2001 | Ho et al. |
| 6,350,635 B1 | 2/2002 | Noble et al. |
| 6,492,233 B2 | 12/2002 | Forbes et al. |
| 6,512,700 B1 | 1/2003 | McPartland et al. |

(Continued)

FOREIGN PATENT DOCUMENTS

EP 2136405 A1 12/2009

OTHER PUBLICATIONS

M. Golden et al. "Sense amp design in SOI", Oct. 3-6, 2005, IEEE International SOI Conference, pp. 118-120.

(Continued)

*Primary Examiner* — Cuong Q Nguyen
(74) *Attorney, Agent, or Firm* — Joseph Abate; Roberts Mlotkowski Safran & Cole, P.C.

(57) ABSTRACT

A read transistor for single poly non-volatile memory using a body contacted SOI transistor and a method of manufacturing the same is provided. The non-volatile random access memory is formed in silicon on insulator (SOI). The non-volatile random access memory includes a read field effect transistor (FET) having a body contact formed in the silicon of the SOI. The body contact is in electrical contact with a diffusion region under a gate of the read FET.

24 Claims, 6 Drawing Sheets

U.S. PATENT DOCUMENTS

| | | | |
|---|---|---|---|
| 6,537,861 B1 | 3/2003 | Kroell et al. | |
| 6,537,871 B2 | 3/2003 | Forbes et al. | |
| 6,593,624 B2 | 7/2003 | Walker | |
| 6,631,087 B2 | 10/2003 | Di Pede et al. | |
| 6,690,056 B1 | 2/2004 | Reedy et al. | |
| 6,711,064 B2 | 3/2004 | Hsu et al. | |
| 6,762,453 B1 | 7/2004 | Simacek et al. | |
| 6,788,574 B1 * | 9/2004 | Han et al. | 365/185.08 |
| 6,888,750 B2 | 5/2005 | Walker et al. | |
| 6,990,020 B2 | 1/2006 | Terzioglu et al. | |
| 7,099,192 B2 | 8/2006 | Wang et al. | |
| 7,129,538 B2 | 10/2006 | Lee et al. | |
| 7,183,164 B2 | 2/2007 | Haller | |
| 7,199,419 B2 | 4/2007 | Haller | |
| 7,250,646 B2 | 7/2007 | Walker et al. | |
| 7,274,072 B2 | 9/2007 | Chang et al. | |
| 7,368,344 B2 | 5/2008 | Haller | |
| 7,391,647 B2 | 6/2008 | Fang et al. | |
| 7,439,574 B2 | 10/2008 | Kim et al. | |
| 7,447,064 B1 | 11/2008 | Bu et al. | |
| 7,489,550 B2 | 2/2009 | Tanaka | |
| 7,495,279 B2 | 2/2009 | Shum et al. | |
| 7,502,262 B2 | 3/2009 | Park et al. | |
| 7,515,478 B2 | 4/2009 | Li et al. | |
| 7,663,173 B1 * | 2/2010 | Desai et al. | 257/300 |
| 7,700,993 B2 * | 4/2010 | Cai et al. | 257/315 |
| 2001/0010957 A1 | 8/2001 | Forbes et al. | |
| 2004/0250221 A1 | 12/2004 | Bard et al. | |
| 2005/0127442 A1 | 6/2005 | Veeraraghavan et al. | |
| 2006/0175661 A1 | 8/2006 | Huang | |
| 2007/0194378 A1 | 8/2007 | Richter et al. | |
| 2007/0296034 A1 | 12/2007 | Chen et al. | |
| 2008/0044959 A1 | 2/2008 | Cheng et al. | |
| 2008/0211035 A1 | 9/2008 | Hirano et al. | |
| 2008/0237708 A1 | 10/2008 | Mandelman et al. | |
| 2008/0310237 A1 | 12/2008 | Zhou et al. | |

OTHER PUBLICATIONS

Jente B. Kuang et al. "Dynamic Body Charge Modulation for Sense Amplifiers in Partially Depleted SOI Technology" IEEE Journal of Solid-State Circuits, vol. 36, No. 4, Apr. 2001,pp. 597-604.

K. Hirose et al. "Analysis of Body-Tie Effects on SEU Resistance of Advanced FD-SOI SRAMs Through Mixed-Mode 3-D Simulations" IEEE Transactions on Nuclear Science, vol. 51, No. 6, Dec. 2004, pp. 3349-3353.

Mario R. Casu et al. "Converting an Embedded Low-Power SRAM from Bulk to PD-SOI", Memory Technology, Design and Testing, 2002. (MTDT 2002). Proceedings of the 2002 IEEE International Workshop on Jul. 10-12, 2002, pp. 163-167.

T. Saraya et al. "Floating Body Effects in 0.15 µm Partially Depleted SOI MOSFETs Below 1 v" Proceeding 1996 IEEE International SOI Conference, Oct. 1996.

Alaim Chun-Keung Chan et al., "Effects of Floating Body on Double Polysilicon Partially Depleted SOI Nonvolatile Memory Cell" IEEE Electron Device Letters, vol. 24, No. 2, Feb. 2003 (1 page).

David Burnett et al., "An Advanced Flash Memory Technology on SOI", 1999 IEEE International SOI Conference, Oct. 1999 (1 page).

Chandra Sekhar A. Durisety et al. "Analysis and Characterization of Single-Poly Floating Gate Device on 0.35-µm Partially-Depleted SOI" (date unknown) (1 page).

Dietmar Gogl et al: "A 1-Kbit EEPROM in SIMOX Technology for High-Temperature Applications up to 250 C" —IEEE Journal of Solid-State Circuits, IEEE Service Center, Piscataway, NJ, USA, vol. 35, No. 10—Oct. 1, 2000, XP011061337.

PCT/EP2010/070366 International Search Report and Written Opinion International Filing Date: Dec. 21, 2010.

* cited by examiner

| NODE | B | T | S | D |
|---|---|---|---|---|
| PROGRAM | 0V | 7V | 1.2V | 1.2V |
| ERASE | 7V | 0V | 1.2V | 1.2V |
| READ | 0V | 0V | 1.2V | 0V |

READ TRANSISTOR FOR SINGLE POLY NON-VOLATILE MEMORY USING BODY CONTACTED SOI DEVICE

FIELD OF THE INVENTION

The invention relates to non-volatile memory and methods of manufacture, and more particularly, to a read transistor for single poly non-volatile memory using a body contacted SOI transistor and a method of manufacturing the same.

BACKGROUND

Flash memory is a non-volatile memory that can be electrically erased and reprogrammed. As flash memory is non-volatile, there is no need to have power to maintain the information stored in the chip. Also, flash memory, when packaged in a, e.g., "memory card," is very durable. For these reasons, flash memory has gained popularity in the use of memory cards and USB flash drives for storage and transfer of data. Flash memory has also become the dominant technology wherever a significant amount of non-volatile, solid state storage is needed. For example, flash memory is used in many common devices such gaming consoles, digital cameras, laptop computers, digital audio players, and cellular telephones.

In traditional stacked flash memory, each memory cell includes two gates, e.g., a bottom floating gate and a top control gate. The floating gate is disposed above the MOSFET channel and is completely insulated about its periphery by an oxide layer. That is, an insulator layer is provided at the interface between the channel of the MOSFET and the floating gate, as well as between the interface of the floating gate and the control gate. The insulator layer (e.g., oxide) between the MOSFET channel and the floating gate is very thick, e.g., about 5-9 nm in thickness, in order to maintain a charge in the floating gate. See, e.g., FIG. 1 which shows a conventional stacked poly based flash memory.

However, the conventional stacked memory cell shown in FIG. 1 cannot be easily integrated into the manufacturing processes for microprocessors due to incompatibility with manufacturing processes of microprocessors. For example, the insulator layer between the floating gate and the MOSFET channel is thicker than required for conventional microprocessors, e.g., about 1 to 2 nm, in order to provide high performance transistors. Also, microprocessors do not include both a control gate and a floating gate, with an insulator layer therebetween.

As an alternative approach, a single poly NVRAM has been used to provide non-dense non-volatile memory functionality in standard CMOS processes. However, implementing the single poly NVRAM in SOI process presents unique challenges due to floating body effect. For example, the read margin is degraded due to dynamic lowering of the threshold voltage. Also, these non-dense devices are limited in application due to its density.

More specifically, as shown in FIG. 2, a single poly NVRAM includes a Si or BULK substrate that has a high voltage requirement, i.e., 7V bias, for the terminal in the program node. In BULK implementation, this high voltage can result in junction breakdown in the devices in the NVRAM and require complicated well-isolation techniques. This problem is mitigated in SOI implementation due to buried oxide (BOX) isolation. Also, as shown in FIG. 2, the coupling capacitor, NMOS read transistor and tunnel capacitor formed in the Si or BULK substrate, which need to be isolated by an STI structure. In BULK implementation, large capacitance between diffusion and wells significantly affects the performance of the cell. When migrated into SOI technology this parasitic capacitance is much smaller due to buried oxide. But in SOI transistors there is no direct contact to the well like in BULK transistors. This leads to floating body effects which reduces the threshold voltage of read transistor dynamically during the read operation and thus degrades the read margin of the cell.

Accordingly, there exists a need in the art to overcome the deficiencies and limitations described hereinabove.

SUMMARY

In first aspect of the invention, a non-volatile random access memory formed in silicon on insulator (SOI). The non-volatile random access memory comprises a read field effect transistor (FET) having a body contact formed in the silicon of the SOI. The body contact is in electrical contact with a diffusion region under a gate of the read FET.

In another aspect of the invention, a non-volatile random access memory comprises a read field effect transistor (FET) having a body contact formed in a silicon layer of a SOI. The read FET further comprises N+ diffusion source and drain regions formed in the silicon layer. A coupling capacitor has diffusion regions isolated from the N+ diffusion source and drain regions of the read FET by isolation regions formed in the silicon of the SOI and buried oxide.

In yet another aspect of the invention, a method of forming a non-volatile random access memory comprises forming a read field effect transistor (FET) having a body contact formed in silicon of SOI, and in electrical contact with a diffusion region under a gate of the read FET.

In a further aspect of the invention, a design structure for forming a transistor is embodied in a machine-readable medium for designing, manufacturing, or testing an integrated circuit. The design structure comprises a read field effect transistor (FET) having a body contact formed in the silicon of the SOI and in electrically contact with a diffusion region under a gate of the read FET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 4b shows a cross sectional view of the Read FET of FIG. 4a;

FIG. 5b shows a cross sectional view of the Read FET of FIG. 5a;

DETAILED DESCRIPTION

The invention relates to non-volatile memory and methods of manufacture, and more particularly, to a read transistor for single poly non-volatile memory using a body contacted SOI transistor and a method of manufacturing the same. More specifically, the present invention provides a single poly NVRAM in SOI technology. Advantageously, the present invention provides naturally isolated diffusion regions (e.g., between coupling capacitor, tunnel capacitor and read transistor), and eliminates junction breakdown. In addition, it is possible to have a much smaller diffusion capacitance compared to that in bulk, which results in faster access time.

The non-volatile memory functionality of the present invention can be formed using standard CMOS processes. The present invention can be used in, for example, in non-dense application such as embedded hardware encryption and a replacement solution for laser or poly efuse, amongst other dense function flash memory uses, e.g., devices that require dense non-volatile storage. Additionally, the present invention provides a dense non-volatile memory solution using single poly technology. Also, the present invention can, amongst other features, enhance application security, reduce overall system cost and analog trimming and calibration.

Figure 1:
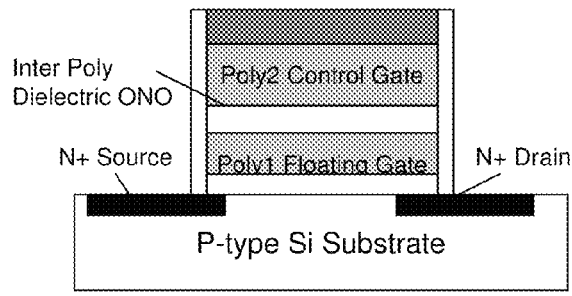
FIG. 1 shows a conventional stacked memory cell.
Figure 2:
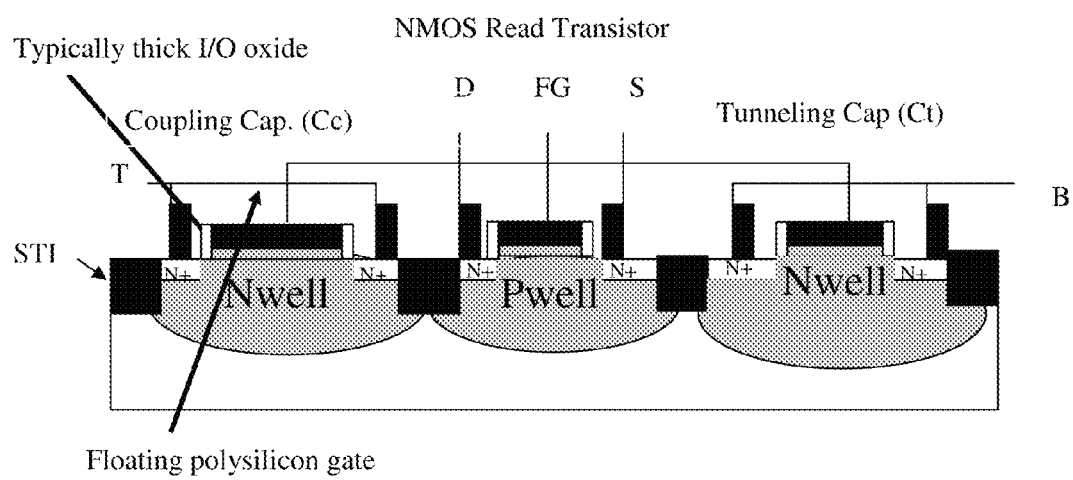
FIG. 2 shows a conventional non-dense single poly memory device with a thick oxide layer.
Figure 2:
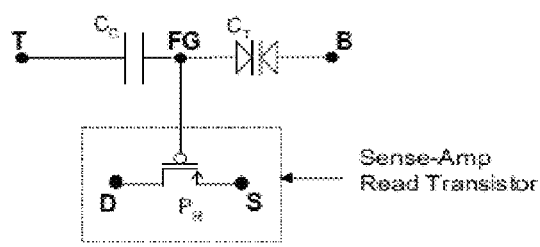
Figure 3:
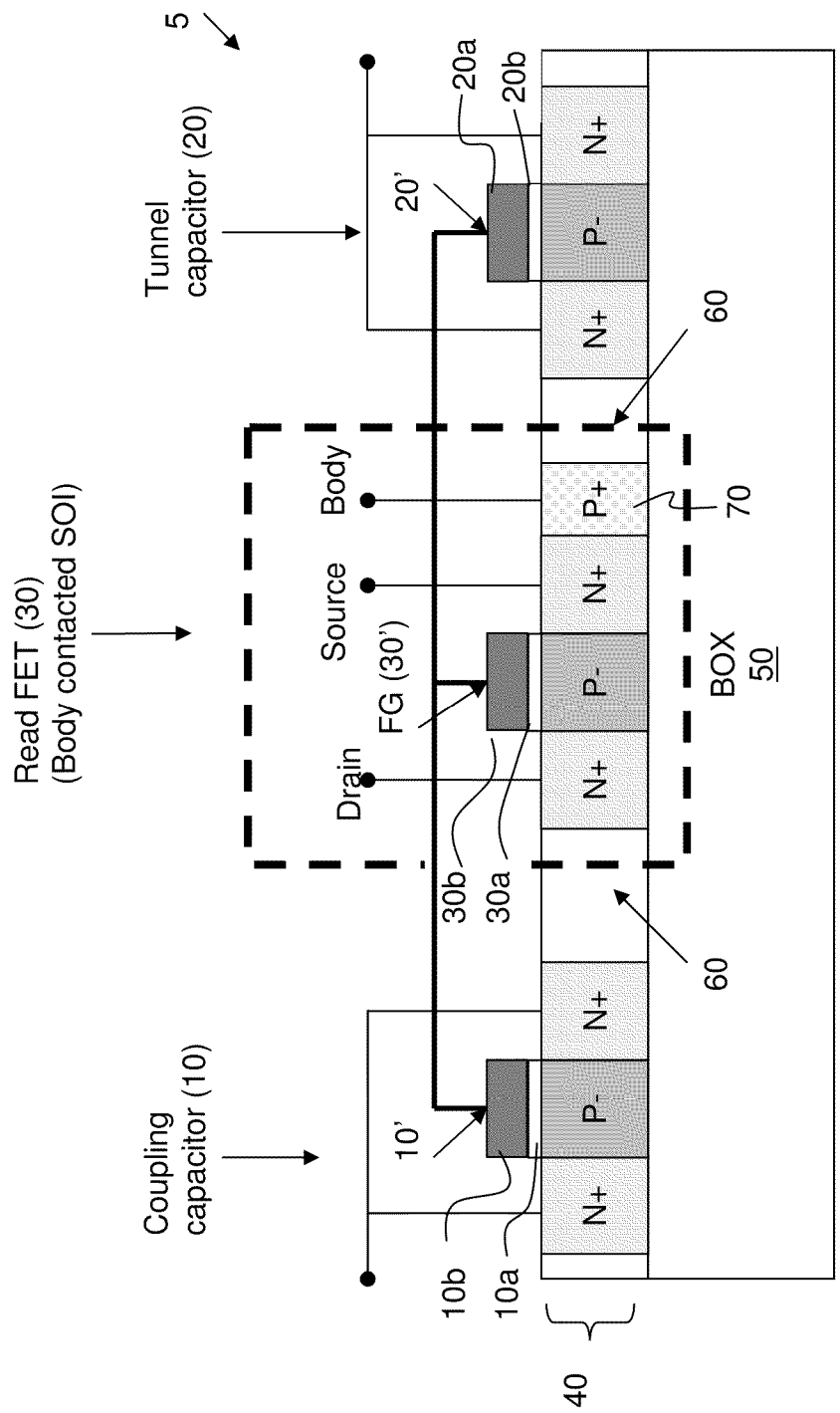
FIG. 3 shows a single poly memory device (Non-volatile random access memory (NVRAM)) in accordance with aspects of the invention.

FIG. 3 shows an example of a single poly (Non-volatile random access memory (NVRAM)) in accordance with invention. The single poly NVRAM 5 of FIG. 3 includes a coupling capacitor 10, a tunnel capacitor 20 and a Read FET 30 (Read FET Body contact SOI 30) formed in a silicon layer 40 (of SOI). In embodiments, the silicon layer 40 is formed on a buried oxide (BOX) layer 50. As shown and described further below, the coupling capacitor 10, tunnel capacitor 20 and Read FET 30 have naturally isolated diffusion regions due to each device 10, 20 and 30 being formed in the silicon layer 40, with an isolation region 60 therebetween.

The coupling capacitor 10 includes a floating gate 10' formed on the silicon layer 40. The floating gate 10' comprises a gate oxide (e.g., poly dielectric) 10a and a poly gate structure 10b formed over a P− diffusion region. The P− diffusion region is a floating well for the coupling capacitor 10, and is formed in the silicon layer 40. The coupling capacitor 10 also includes N+ diffusion regions formed in the silicon layer 40. Alternately, the coupling capacitor can also be formed in N− floating well with P+ diffusion regions. Similarly, the tunnel capacitor 20 is formed on the silicon layer 40 and includes a floating gate 20' comprising a gate oxide (e.g., poly dielectric) 20a and a poly gate structure 20b formed over a P− diffusion region. The P− diffusion region is formed in the silicon layer 40, The tunnel capacitor 20 also includes N+ diffusion regions formed in the silicon layer 40. Alternately, the tunnel capacitor can also be formed in N− floating well with P+ diffusion regions. In embodiments, the gates 10' and 20' can also include sidewalls or spacers.

The Read FET 30 is also formed on the silicon layer 40. The Read FET 30 includes a floating gate 30' comprising a gate oxide (e.g., poly dielectric) 30a and a poly gate structure 30b formed over a P− diffusion region. In embodiments, the Read FET 30 can be an NFET or PFET Read FET. The Read FET also includes N+ diffusion regions, which form the source and drain. The P− diffusion region and the N+ diffusion regions are formed in the silicon layer 40. In embodiments, the N+ diffusion regions of the Read FET 30 are naturally isolated from the adjacent transistors (e.g., coupling capacitor 10 and tunnel capacitor 20) by the isolation regions 60 formed from the silicon layer 40.

The Read FET 30 also includes a P+body contact 70, adjacent to the N+ diffusion region (source). In embodiments, the P+ body contact 70 can be either an H-type or T-type body contact, connected to the P− diffusion region. The P+ body contact 70 is formed in the silicon layer 40. The connection between the P+ body contact 70 and the P− diffusion region ensures that the P− diffusion region does not float for the Read FET 30. In this way, the P+ body contact 70 in the silicon-on-insulator (SOI) wafer (40, 50) will eliminate the floating body effect, which would otherwise degrade read margins in the Read FET. Also, in the H-type and T-type implementation, further improvement in read margin can be achieved due to accumulation of active area under the bridge region of the body. Thus, advantageously, the P+ body contact 70 will improve read operations of the Read FET.

In embodiments, the single poly NVRAM 5 of FIG. 3 can be formed using standard CMOS processes and steps. For example, the poly-dielectric (oxide) and poly gate can be deposited on the silicon layer using conventional deposition processes such as, for example, chemical vapor deposition (CVD), amongst other deposition processes. The oxide layer, for example, can be advantageously deposited or thermally grown to a thickness of about 5-9 nm. dielectric thickness is chosen to simultaneously best optimize speed and retention of NVRAM for a particular application. The oxide layer and poly gate can be patterned using conventional lithographic and etching (e.g., RIE) processes, known to those of skill in the art. The diffusion regions and P+ body contact 70 can be formed using conventional implantation processes, using known dopants at known concentrations. For example, the doping concentration of boron in the silicon substrate can be about $1\times10^{16}$ cm$^{-3}$, and that of arsenic in the source and drain region can be about $1\times10^{20}$ cm$^{-3}$. The doping concentration of arsenic in poly gate can be about $1\times10^{18}$ cm$^{-3}$. In this way, it is now possible to form non-volatile memory functionality in standard CMOS processes.

Figure 4A:
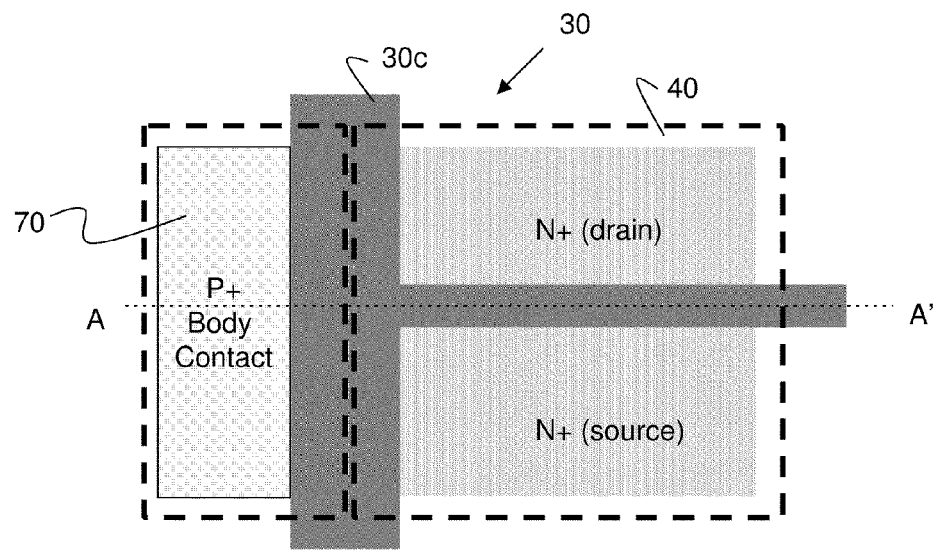
FIG. 4a shows a top view of a Read FET of the NVRAM of FIG. 3 in accordance with aspects of the invention.

FIG. 4a shows a top view of the Read FET 30 of FIG. 3 in accordance with aspects of the invention. This embodiment shows a low voltage state, e.g., no charge in the poly gate 30' (e.g., State=0 (Low Vt)). As shown in FIG. 4a, the P+ body contact 70 is shown to be formed adjacent a bridge portion 30c of the poly gate 30', in the silicon layer 40.

Figure 4B:
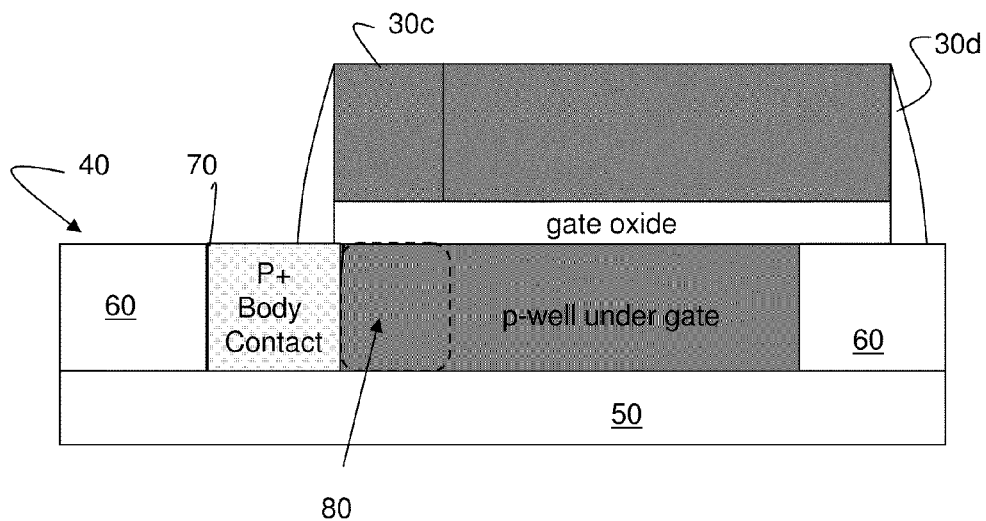

FIG. 4b shows a cross sectional view of the structure of FIG. 4a. As shown in this cross sectional view, the gate poly layer 30c is formed on the gate oxide layer 30b. In this embodiment, spacers 30d are formed on the sidewalls of the gate 30'. The isolation regions 60, the P+ body contact 70 and the p-well are formed in the same layer or level (e.g., silicon layer 40). A portion of the p-well, generally designated as reference numeral 80, is formed under the bridge 30c. This also illustrates the condition when no electrons are stored on the floating gate 30' (e.g. State=0 (Low Vt)).

Figure 5A:
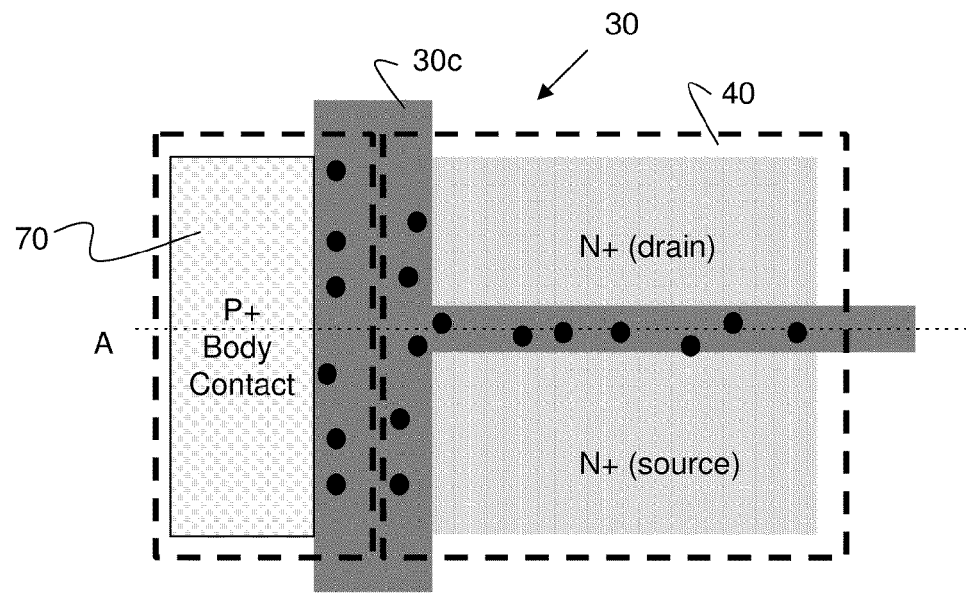
FIG. 5a shows a top view of the Read FET in accordance with aspects of the invention.
Figure 5B:
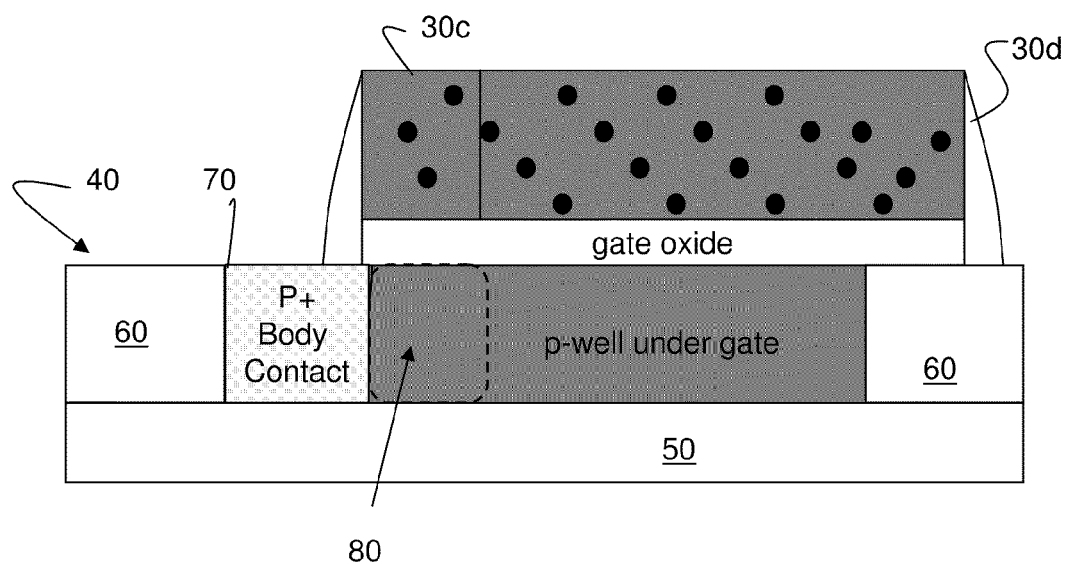

FIG. 5a shows a top view of the Read FET 30 of FIG. 3 in accordance with aspects of the invention. In this embodiment, electrons are stored in the floating gate 30' (e.g., State=1 (High Vt)). Electrons in the floating gate 30' cause the region under the bridge 80 to accumulate and provide for better body contact (with the body contact 70 and P− diffusion region) during the high Vt state. Thus, the high Vt state is further strengthened and improves read margin.

Figure 6:
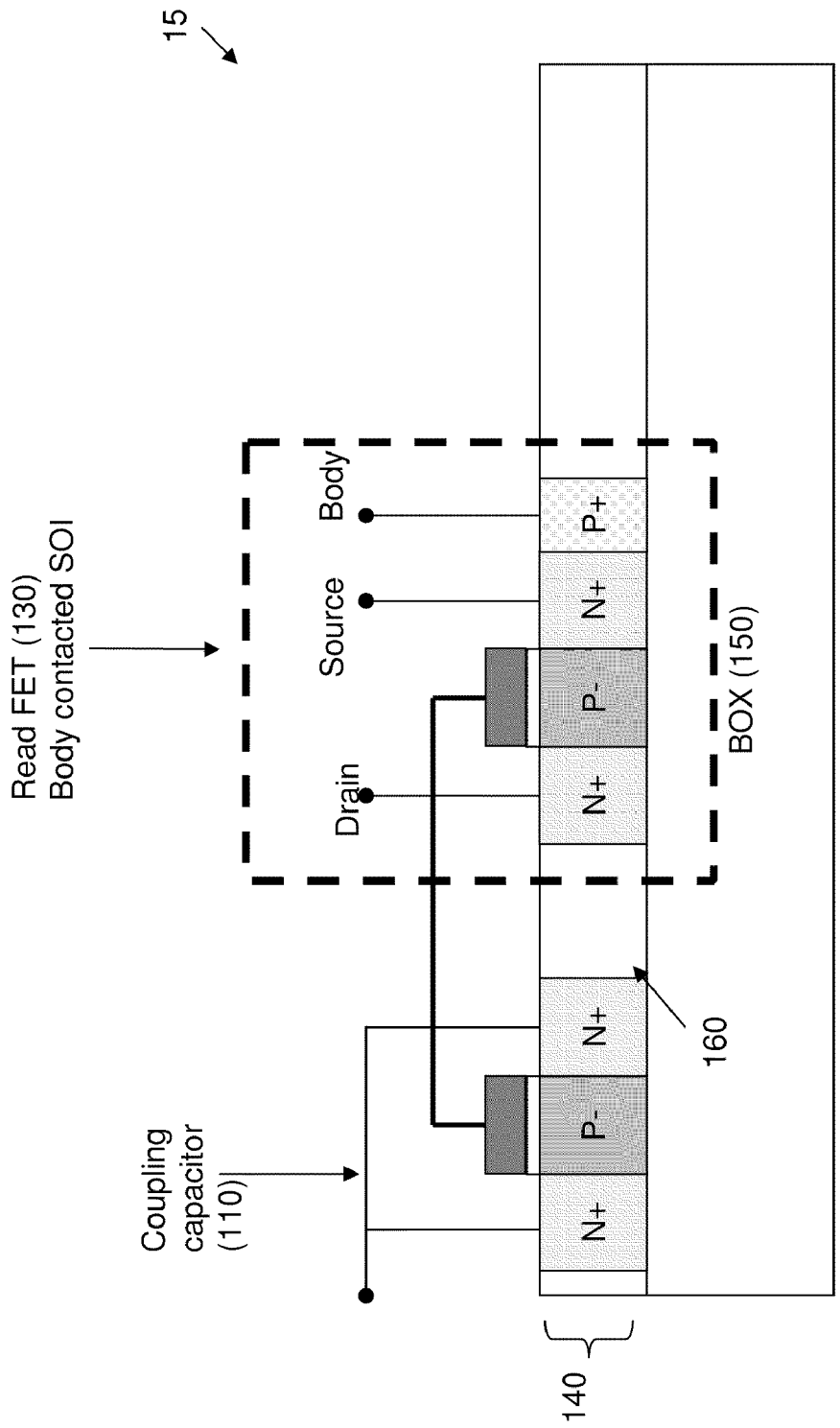
FIG. 6 shows an alternative NVRAM embodiment in accordance with aspects of the invention.

FIG. 6 shows an alternative single poly memory device (NVRAM) in accordance with aspects of the invention. In this alternative cell structure, to save area, functionality of tunnel capacitor and Read FET is implemented in the same structure. In this embodiment, the NVRAM 15 includes the coupling capacitor 110 and the Read FET 130 (Read FET Body contact SOI) formed in the silicon layer 140. In this embodiment, the silicon layer 140 is formed on the buried oxide (BOX) layer 150. And, as previously described, the diffusion regions of the coupling capacitor 110 and the Read FET 130 have naturally isolated diffusion regions due to the fact that each device 110, 130 is formed in the silicon layer 140, with an isolation region 160 therebetween. As in the aspect shown in FIG. 3, the NVRAM of FIG. 6 can be fabricated using standard CMOS processes.

DESIGN STRUCTURE

Figure 7:
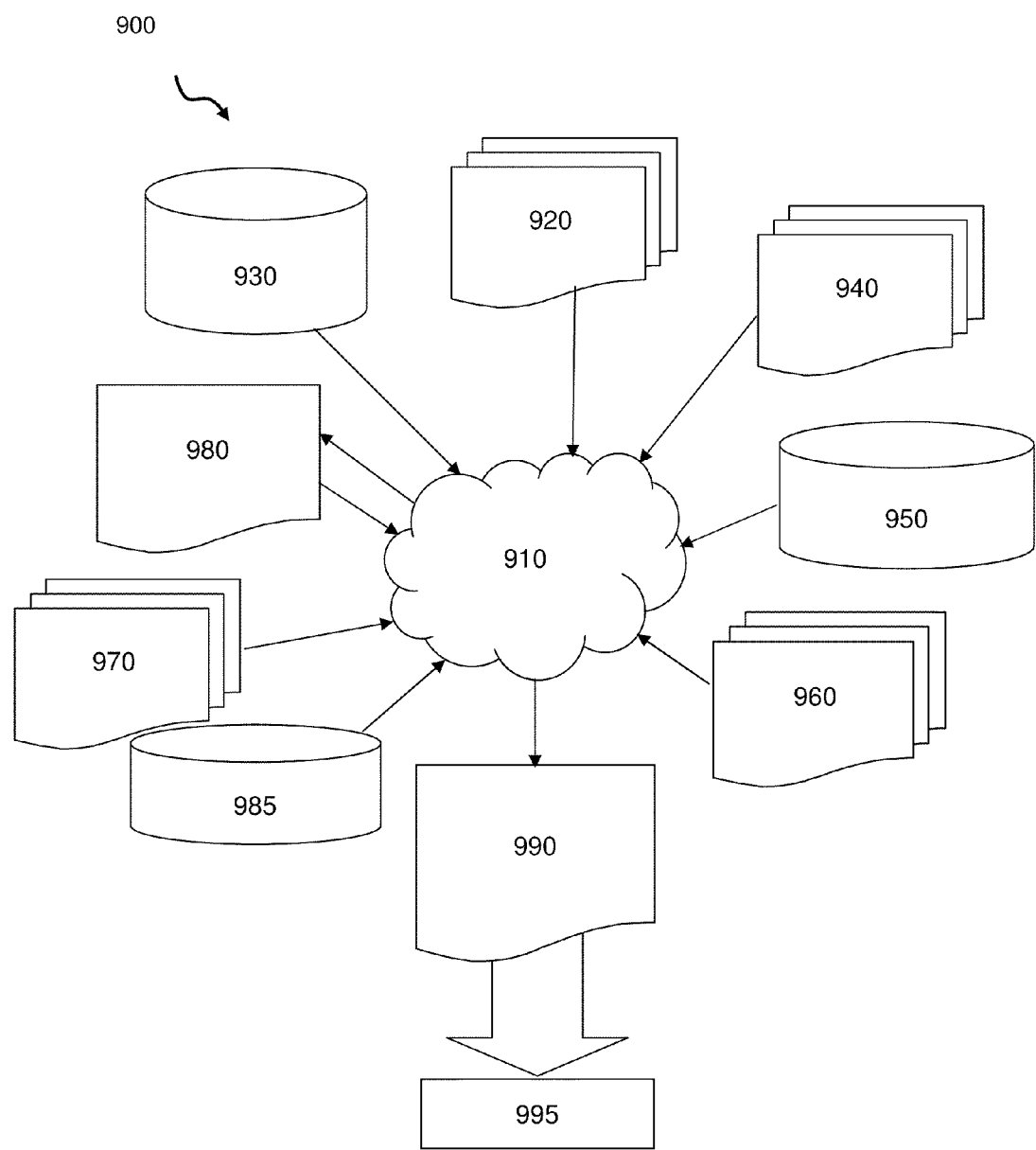
FIG. 7 is a flow diagram of a design process used in semiconductor design, manufacture, and/or test.

FIG. 7 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 3-6 in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 3-6. Design process 910 preferably synthesizes (or translates) embodiments of the invention as shown in FIGS. FIGS. 3-6 into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 3-6, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 3-6. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A non-volatile random access memory formed in silicon on insulator (SOI) comprising a read field effect transistor (FET) having a body contact formed in the silicon of the SOI, the body contact being in electrical contact with a diffusion region under a gate of the read FET.

2. The non-volatile random access memory of claim 1, wherein the body contact is a T-type or H-type body contact.

3. The non-volatile random access memory of claim 1, further comprising a coupling capacitor and a tunnel capacitor.

4. The non-volatile random access memory of claim 3, wherein the coupling capacitor and the tunnel capacitor include N+ or P+ diffusion regions formed in the silicon of the SOI and which are isolated from the read FET by isolation regions formed in the silicon of the SOI and buried oxide.

5. The non-volatile random access memory of claim 1, wherein the read FET is an NFET.

6. The non-volatile random access memory of claim 1, wherein the read FET is a PFET.

7. The non-volatile random access memory of claim 1, further comprising a coupling and tunnel capacitor having N+ or P+ diffusion regions isolated from the read FET by isolation regions formed in the silicon of the SOI and buried oxide.

8. The non-volatile random access memory of claim 1, wherein the read FET includes a gate structure comprising a gate oxide layer having a thickness of about 5 to 9 nm.

9. The non-volatile random access memory of claim 1, wherein the read FET includes a gate structure having a bridge, wherein electrons in the gate structure cause a diffusion region under the bridge to accumulate and provide body contact during high Vt.

10. A non-volatile random access memory comprising:
a read field effect transistor (FET) having a body contact formed in a silicon layer of a SOI, the read FET further comprising a diffusion region under a gate structure formed in the silicon layer, and which is in electrical contact with the body contact; and
a coupling capacitor having N+ or P+ diffusion regions isolated from the read FET by isolation regions formed in the silicon of the SOI and buried oxide.

11. The non-volatile random access memory of claim 10, wherein the body contact is a T-type or H-type body contact.

12. The non-volatile random access memory of claim 10, wherein the N+ or P+ diffusion regions of the coupling capacitor are formed in the silicon and isolated from the read FET isolation regions.

13. The non-volatile random access memory of claim 10, wherein the read FET is an NFET.

14. The non-volatile random access memory of claim 10, wherein the read FET is a PFET.

15. The non-volatile random access memory of claim 10, wherein the gate structure comprises a gate oxide layer having a thickness of about 5 to 9 nm.

16. A method of forming a non-volatile random access memory, comprising:
forming a read field effect transistor (FET) having a body contact formed in silicon of SOI, and in electrical contact with a diffusion region under a gate of the read FET.

17. The method of claim 16, further comprising forming a coupling capacitor having a floating gate with source and drain regions formed in the silicon and isolated from a source or drain region of the read FET by isolation regions formed in the silicon of the SOI and buried oxide.

18. The method of claim 16, further comprising forming a tunnel capacitor having a floating gate with source and drain regions formed in the silicon and isolated from a source or drain region of the read FET by isolation regions formed in the silicon of the SOI and buried oxide.

19. The method of claim 16, wherein the body contact is a P+ diffusion formed in the silicon.

20. The method of claim 16, wherein the body contact is formed as a T-type of H-type body contact.

21. The method of claim 16, wherein the read FET includes a diffusion region under the gate of the read FET which accumulates electrons during a high Vt state.

22. The method of claim 16, wherein the read FET is formed with an oxide layer between a poly gate and the silicon, wherein the oxide layer is about 5 to 9 nm in thickness.

23. A design structure embodied in a machine readable medium for designing, manufacturing, or testing an integrated circuit, the design structure comprising a read field effect transistor (FET) having a body contact formed in the silicon of the SOI and in electrically contact with a diffusion region under a gate of the read FET.

24. The design structure of claim 23, wherein the design structure resides on storage medium as a data format used for the exchange of layout data of integrated circuits.

* * * * *